(12) United States Patent
Chou et al.

(10) Patent No.: US 7,557,293 B2
(45) Date of Patent: Jul. 7, 2009

(54) THERMOPHOTOVOLTAIC POWER SUPPLY

(75) Inventors: Siaw Kiang Chou, Summerhill (SG); Chang Shu, Singapore (SG); Wen Ming Yang, Singapore (SG); Hong Xue, Irvine, CA (US); Zhi Wang Li, Singapore (SG)

(73) Assignee: National University of Singapore, Singapore (SG)

( * ) Notice: Subject to any disclaimer, the term of this patent is extended or adjusted under 35 U.S.C. 154(b) by 858 days.

(21) Appl. No.: 10/728,108

(22) Filed: Dec. 3, 2003

(65) Prior Publication Data

US 2005/0121069 A1    Jun. 9, 2005

(51) Int. Cl.
    *H01L 31/09* (2006.01)
(52) U.S. Cl. .................................. 136/253; 136/244
(58) Field of Classification Search ................. 136/253, 136/244
    See application file for complete search history.

(56) References Cited

U.S. PATENT DOCUMENTS

| 4,776,895 | A |   | 10/1988 | Goldstein |
| 5,512,108 | A | * | 4/1996  | Noreen ........................ 136/253 |
| 5,593,509 | A | * | 1/1997  | Zuppero et al. .............. 136/253 |
| 6,043,426 | A | * | 3/2000  | DePoy et al. ................. 136/253 |
| 6,218,607 | B1 |  | 4/2001  | Mulligan et al. |
| 6,489,553 | B1 | * | 12/2002 | Fraas et al. ................... 136/253 |
| 6,786,716 | B1 | * | 9/2004  | Gardner et al. ............... 431/268 |
| 2006/0107995 | A1 | * | 5/2006 | Kovacik et al. .............. 136/253 |

OTHER PUBLICATIONS

Ferguson, L.G. et al, "A highly efficient NiO-Doped MgO matched emitter for thermophotovoltaic energy conversion". Materials Science and Engineering. B83, 35-41. (2001).*

Ole M. Nielsen, et al., *A Thermophotovoltaic Micro-Generator for Portable Power Applications*, Microsystems Technology Laboratories, Transducers '03, The 12$^{th}$ International Conference on Solid State Sensors, Actuators and Microsystems, Boston, Jun. 8-12, 2003.

W.M. Yang., et al., Design, Fabrication and Testing of a Prototype Microthermophotovoltaic System, Department of Mechanical Engineering, National University of Singapore, 10 Kent Ridge Crescent, Singapore 119260, 2004.

(Continued)

*Primary Examiner*—Jeffrey T. Barton
(74) *Attorney, Agent, or Firm*—Townsend and Townsend and Crew LLP

(57) ABSTRACT

A microthermophotovoltaic (micro-TPV) system is a novel micro power device. The system fully utilizes the high surface-to-volume ratio of a microcombustor, and is able to deliver and electrical power output of 0.5-10 W in a package of the order of centimeters. The system comprises mainly a combustor-emitter, a filter, a photovoltaic (PV) cell array, and cooling fins. The combustor-emitter functions to convert chemical energy into radiative heat energy. The filter is able to recycle a large part of the unusable energy that cannot be converted into electricity by the PV cell array. The PV cell array is used to convert radiative heat energy into electricity. The system has no moving parts. Its fabrication and assembly are relatively easy. As a result, it can be readily used as a power source of micro mechanical devices and portable devices, in which convenience and low cost reliability and ease of maintenance are the key factors of consideration.

18 Claims, 11 Drawing Sheets

OTHER PUBLICATIONS

Leonel R. Arana, et al., *Combustion-Assisted Hydrogen Production in a High-Temperature Chemical Reactor/heat Exchanger for Portable Fuel Cell Applications*, Transducers '03, The 12$^{th}$ International Conference on Solid State Sensors, Actuators and Microsystems, Boston, Jun. 8-12, 2003.

Leonel R. Arana, et al., *A Microfabricated Suspended-Tube Chemical Reactor for Fuel Processing*, Dept. of Chemical Engineering, Massachusetts Institute of Technology, Cambridge MA 02139, 2002.

Janet L. Pan, *Very Large Radiative Transfer over Small Distances form a Black Body for Thermophotovoltaic Applications*, IEEE Transactions on Electron Devices, vol. 47, No. 1, Jan. 2000.

A. Carlos Fernandez-Pello, *Micro-Power Generation Using Combustion: Issues and Approaches*, Prepared for presentation as a Topical Review at the Twenty-Ninth International Symposium on Combustion, Jul. 21-26, Sapporo, Japan, 2002.

S. Whalen, et al., *Design, Fabrication and Testing of the $P^3$ Micro Heat Engine*, Sensors and Actuators, A 3649, pp. 1-9, 2003.

A. H. Epstein., et al., *Micro-Heat Engines, Gas Turbines, and Rocket Engines—The MIT Microengine Project*, American Institute of Aeronautics and Astronautics, 1997.

Lars Sitzki, et al., *Combustion in Microscale Heat-Recirculating Burners*, The Third Asia-Pacific Conference on Combustion, Jun. 24-27, 2001.

\* cited by examiner

THERMOPHOTOVOLTAIC POWER SUPPLY

BACKGROUND OF THE INVENTION

The present invention relates generally to thermophotovoltaic generators, and more particularly but not solely to micro generators.

There is a rapidly growing trend in the miniaturization of mechanical and electro-mechanical engineering devices. All kinds of microdevices such as micro-pumps, micro-motors, micro-robots, micro-rovers and micro-airplanes are being developed. However, the miniaturization of these devices is limited by the weight of the available power systems (batteries) that occupy significant fractions of both mass and volume of the entire devices. Typical portable mechanical devices also suffer from short operating cycles between charges or replacement. The need to reduce system weight and increase operational lifetimes is behind the emergence of a new class of microelectromechanical system (MEMS) devices, micro power generators that are characterized by high power and energy density but small in size and weight, and are cost effective.

It is well known that hydrogen and hydrocarbon fuels have energy densities much greater than the best batteries. For example, hydrogen fuels provide an energy storage density of typically 120 MJ/kg, whereas the state-of-the-art lithium ion batteries commonly used in cell phones and laptop computers provide only about 0.5 MJ/kg. Thus even at only 10% conversion efficiency from thermal to electrical energy, hydrogen fuels are 24 times more powerful than batteries. The advantages of hydrogen fuels also include being inexpensive, having more constant voltage, suffering no memory effect, and being capable of instant recharge. Therefore, taking advantage of the high energy density of chemical fuels to generate power becomes an attractive technological alternative to batteries.

Micro-gas turbine engines, micro-rotary engines (Wankel-type), micro-thermoelectric and micro-fuel cells are typical micro power generators being developed currently. The above micro-power systems experience one major challenge, the high heat losses due to the high surface-to-volume ratio. According to the cubic-square law, when the size of a microdevice decreases by a factor of 100, the surface to volume ratio will increase by a factor of 100. Therefore, with the same heat flux density per unit surface, the heat flux via the wall will increase by a factor of 100 per unit volume of a microcombustor.

Thus, what is needed is a device which ameliorates the difficulties identified in the abovementioned prior art or at least provides the public with a useful choice.

BRIEF SUMMARY OF THE INVENTION

In a first embodiment, the present application provides a micro TPV generator comprising:

a combustion chamber configured to generate a significantly even temperature distribution on an outer wall thereof, an emitter engaged around or at least in thermal connection to said chamber, and a photovoltaic cell in proximity to said emitter and configured to generate an electrical current depending on photons incident thereon.

In one embodiment, the chamber includes a platinum catalyst coating an inner wall. Further, in another embodiment, the outer wall is substantially cylindrical. In yet another embodiment, the chamber includes a backwards facing step.

In still another embodiment, the emitter can have an emission characteristic matched to the bandgap characteristic of the cell. Further the emitter can be formed of Co—/Ni-doped MgO ribbon or tape, or the emitter can be formed of SiC.

In yet another embodiment, the generator further comprises a filter between the emitter and the cell configured to pass photons above a threshold and reflect photons under said threshold. In one embodiment, the filter comprises 9 layers of Si—SiO2 bonded between a glass slide and the cell. Further, in one embodiment, the cell can be formed from a GaSb based semiconductor.

In still another embodiment, the chamber can have an internal diameter less than 1 mm for hydrogen fuel at compressed pressure. Further, the chamber can have an internal diameter less than 3 mm for propane at atmospheric pressure.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting.

The invention consists in the foregoing and also envisages constructions of which the following give examples.

BRIEF DESCRIPTION OF THE DRAWINGS

The present invention will now be described with reference to the accompanying drawings in which.

DETAILED DESCRIPTION OF THE INVENTION

The present invention overcomes or at least ameliorates the shortcomings of high heat loss due to the high surface-to-volume ratio of a microcombustor. The micro-TPV system is a novel micro power generator which uses photovoltaic (PV) cells to convert heat radiation, for example from the combustion of fuels, into electricity. For micro-TPV application, the desired output is a high and uniform temperature along the wall of the microcombustor. Compared to conventional macro-TPV systems, the micro-TPV systems feature a much higher power density per unit volume due to the high surface-to-volume ratio.

For example, for a macro-TPV system with a cylindrical combustor of 50 cm in length and 20 cm in diameter, the surface and volume of the combustor are 3142 cm² and 15708 cm³. Assuming the radiation power density is 10 W/cm², the total radiation power from the combustor is 31420 W, corresponding to a volumetric power density 2 W/cm³. However, for a micro-TPV system with a cylindrical combustor of 2 cm in length and 0.3 cm in diameter, the surface and volume of the combustor are 1.88 cm² and 0.14 cm³. Assuming the radiation power density remains 10 W/cm², then the total radiation power is 18.8 W, corresponding to a volumetric power density 133.3 W/cm³. There are therefore considerable advantages to be achieved by the development of a miniaturized TPV system.

The major challenge in a micro combustor design is achieving an optimum balance between sustaining combustion and maximizing heat output. High surface-to-volume ratio is very favourable to the output power density per unit volume. However, high heat output will affect stable combustion in the micro-combustor. To investigate the feasibility of micro combustion and optimize the design of a micro combustor, numerical simulation and experimental work was conducted. Results indicated that a micro cylindrical flame tube with a backward facing step was one of the simplest but most effective structures for application in a micro-TPV system. Platinum may be employed as catalyst to further improve combustion. Furthermore, it is preferable to minimize the clearance between PV cells, compared to macro-TPV system, as the clearance has a bigger effect on the performance of micro-TPV system.

Figure 1:
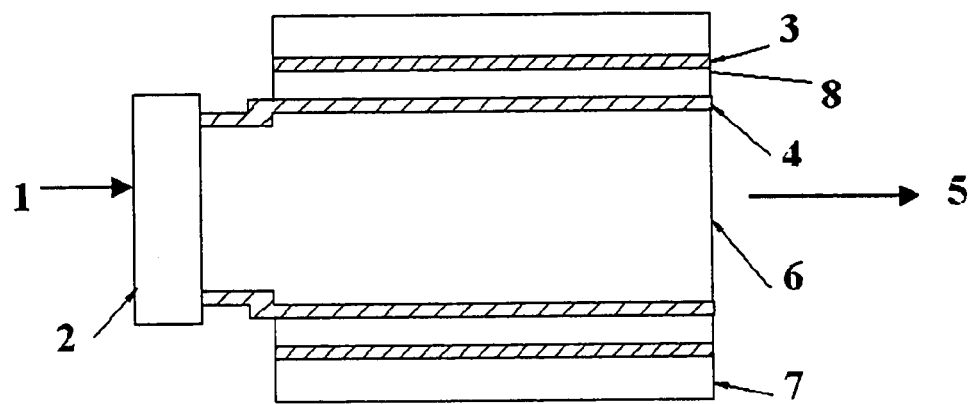
FIG. 1 illustrates the basic design of a micro thermophotovoltaic system.

A micro-TPV system is a new power MEMS concept. The system uses PV cells to convert heat radiation, for example, from the combustion of fossil fuels, into electricity. FIG. 1 shows the structure of a micro-TPV system. The system comprises of a heat source, a cylindrical SiC emitter or selective emitter (i.e. microcombustor), a filter, a PV cell array and cooling fins. Fuel and air are mixed in micromixer (2), and enter into the micro cylindrical flame tube combustor (6) via inlet (1) and combust there. The energy released from combustion of fuel/air mixture then heats the wall of micro cylindrical combustor. The combustor is in thermal connection with emitter (4) and, when heated to a sufficient temperature, the emitter radiates a lot of photons. Filter (8) can transmit most of the photons with energy greater than the bandgap of PV cells (3), while reflecting a large portion of photons with energy lower than the bandgap of the PV cells (3) to the emitter. When those photons with energy greater than the bandgap of the PV cells impinge on the PV cells, it evokes free electrons and produces electrical power output under the pn junction of the PV cells. Disposed about the exterior of the micro TPV system are micro cooling fins (7) to regulate the temperature of the system. Alternatively, temperature regulating means may be provided, for example a vacuum jacket or a refrigerant system. Exhaust gases exit the system via outlet port (5).

After the mathematical modeling discussed later, hydrogen was chosen as the fuel for experimental work. However, any commercially available gaseous, liquid or solid fuels may be used to start and sustain the combustion. The micro cylindrical combustor-emitter functions to convert chemical energy into radiative heat energy. The filter transmits photons with energy greater than the bandgap of PV cells, and reflects photons with energy lower than the bandgap of PV cells to the emitter. The PV cell array functions to convert radiative heat energy into electrical power output. The micro-TPV system therefore does not involve any moving parts. Its fabrication and assembly are relatively easy and it can be widely used in commercial electronics and microdevices.

Micro TPV System Modeling

A mathematical model may be used to predict the performance of the micro-TPV system.

The reverse saturation current, $J_0$, of a p/n junction is given by $$J_0 = \beta(E_g) T_c^3 \exp(-E_g/kT_c),$$

$$\beta(E_g) = 3.165 \times 10^{-4} \exp(2.912 E_g),$$

where $T_c$ is the working temperature of the PV cell, $E_g$ is the band gap of the PV cells, and k is the Boltzmann constant, The short-circuit current of PV cells is then given by $$J_{sc} = qF_{cs} \int \frac{W(\lambda, T) Q(\lambda) d\lambda}{hc/\lambda},$$

wherein q is the electrical charge, $F_{cs}$ is a geometrical factor that compensates for the distance from the source to the cell which is set equal to 1 for this calculation, $W(\lambda,T)$ is the spectral distribution radiated by a selective emitter, h is the Planck constant, c is the speed of light, $\lambda$ is the wavelength, T is the temperature of emitter, and $Q(\lambda)$ is the quantum efficiency as a function of the wavelength for the cell.

The open-circuit voltage $V_{oc}$, can be determined by $$V_{oc} = (kT_c/q) \ln(J_{sc}/J_0 + 1).$$

The voltage at the maximum power point, $V_m$, can be obtained by solving $$V_{oc} - (kT_c/q) \ln\lfloor 1 + qV_{mp}/kT_c \rfloor + V_{mp}.$$

Then, the maximum power $P_m$ can be obtained by $$P_m = qJ_{sc}(V_{mp})^2/(kT + qV_{mp}).$$

The efficiency of the burner is $$\eta_{TPV} = P_m/H_{fuel} m$$

where $H_{fuel}$ is the heat value of the fuel and m is the fuel mass flow rate.

Combined with the experimental results of the micro flame tube, the selective emitter and the GaSb cells, an electricity power output of 4.5 W in a microcombustor 0.1 cm³ in volume can be predicted. The micro-TPV system has a total volume in the order of 1 cm

3.

Micro Combustor

In one embodiment, the microcombustor may be made of graybody emitting materials, for example, SiC materials, or selective emitting materials, for example Co—/Ni-doped MgO, microstructured tungsten or oxides of rare earth materials such as erbia ($Er_2O_3$) and ytterbia ($Yb_2O_3$) but is not limited thereto. It is known in the art that doping concentrations of 2-4 wt % $Co_3O_4$ or NiO into an infrared transparent MgO host can produce matched emitters with continuous, strong radiant emissions in the optimal energy range of 1-2 µm, and minimal energy at nonconvertible wavelengths.

Such a matched emitter may be produced by a number of known fabrication techniques. For example tape casting, whereby flexible tapes comprising the emitter of the invention are formed which may be cut into ribbons and woven into any structure. Especially at micro scale, a single ribbon may be rolled into a micro cylindrical combustor easily. An emitter formed by this technique is capable of withstanding high temperatures and is therefore very suitable for application in micro-TPV systems.

In a further embodiment, a thin layer platinum can be deposited on the inner surface of micro-combustor to act as a catalyst further improving the combustion and in turn improving the efficiency of micro-combustor. A platinum cylindrical combustor with the same size as the stainless steel cylindrical combustor depicted in FIG. 2 and described below has been tested. Under the same conditions, the mean wall temperature was 200 K higher than that of the stainless steel tube. The emissive spectral distribution and power density of an emitter can be improved drastically with the increase of mean wall temperature by depositing a thin layer platinum film of 1-5 micron on the inner surface of the micro combustor. The thin layer of platinum may be deposited by a number of known in the art techniques, for example sputtering, chemical vapour deposition (CVD) and/or ion beam deposition. Such layers may be deposited on a number of materials, including for example SiC.

Figure 10:
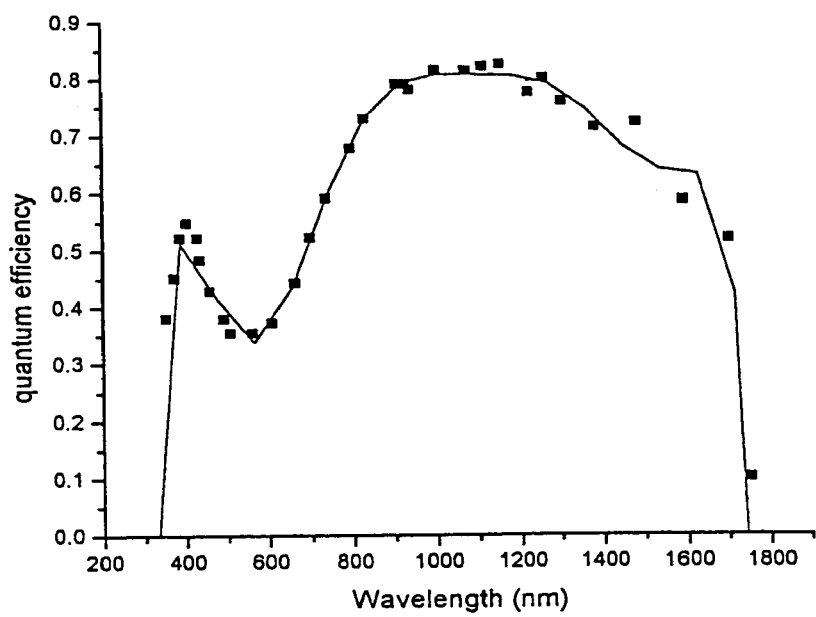
FIG. 10 illustrates the quantum efficiency of GaSb photovoltaic cells.

By matching the actual spectral distribution radiated by the selective emitter with a PV Cell which converts photons to electrons at an appropriate wavelength, a high quantum efficiency PV cell array can be fabricated as illustrated by the GaSb PV cells in FIG. 10.

Figure 2:
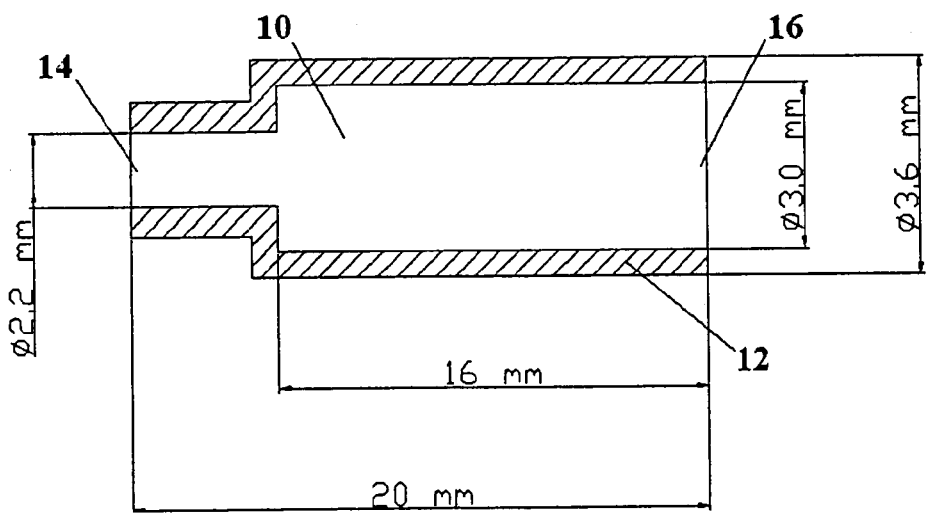
FIG. 2 illustrates the structure and dimensions of a micro cylindrical SiC emitter of the invention.

A micro cylindrical combustor with a backward facing step is employed in the design of micro-TPV systems, see FIG. 2. A fuel/air mixture enters the combustor at entry point (14) and exit as exhaust gases. The length of combustion chamber L1 can be any value from 10 mm-30 mm, e.g. 16 mm. Accordingly, L2 also ranges from 14 mm-34 mm, e.g. 20 mm. The inner diameter of combustion chamber can also vary between 1.5 mm to 4.0 mm to meet different requirements, e.g. 3.0 mm. The thickness of the wall (12) can be any value between 0.1 mm to 0.5 mm, e.g. 0.3 mm. The backward facing step (10) can be 0.2 mm to 0.6 mm, e.g. 0.4 mm.

Figure 3:
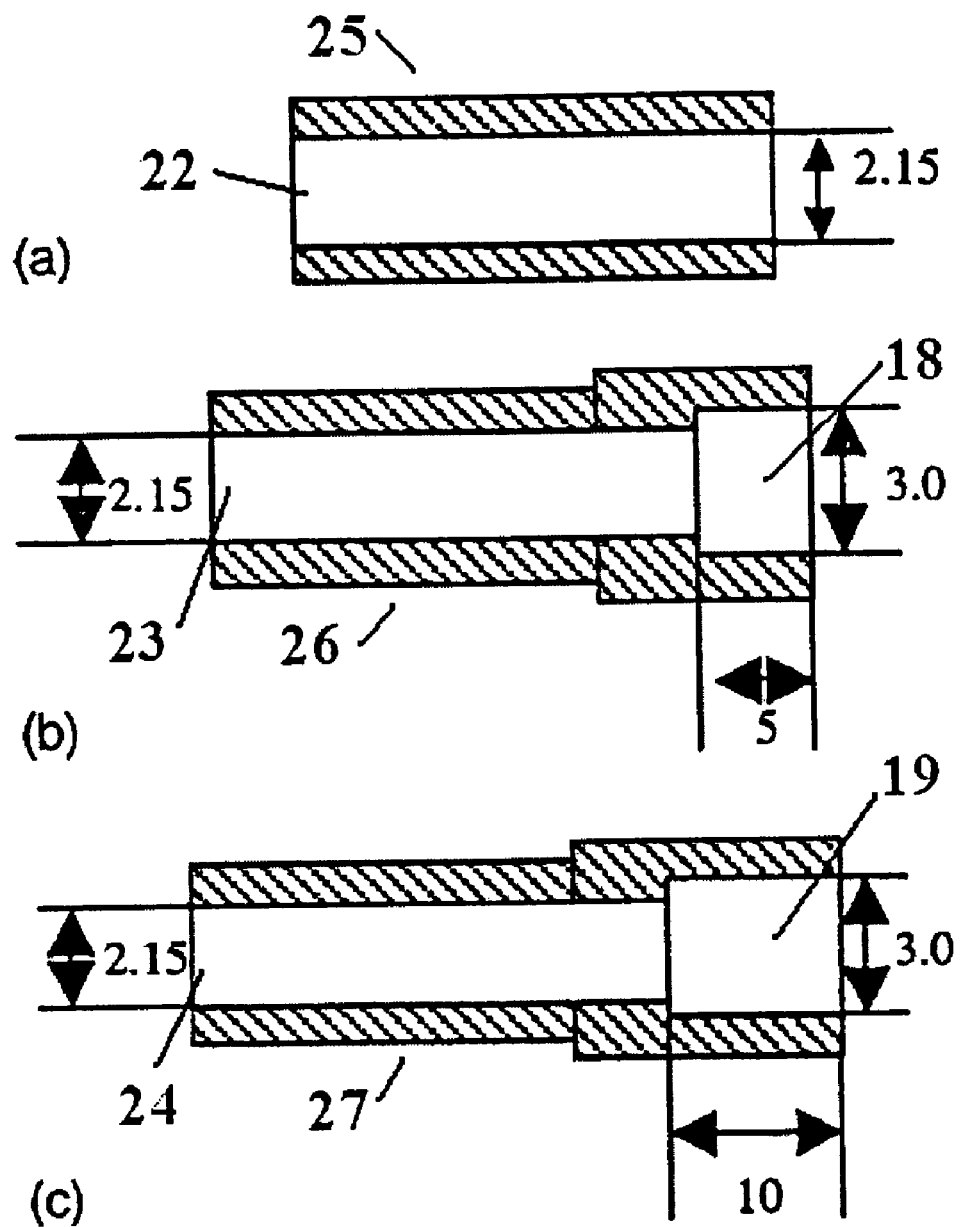
FIG. 3 illustrates the configuration and specifications of three combustors (unit m×10-3). (a) is tube #1, (b) is tube #2 and (c) is tube #3.

To investigate the stability of the flame and validate the simulation results, at the same time, for simplicity of fabrication, three kinds of different stainless steel flame tube combustors (one is straight tube (25) of 2.15 mm diameter, the other two flame tubes (26, 27) comprising a sudden expansion step (18, 19), having the diameter of 3 mm) were fabricated and tested. The construction and specifications of the three flame tube combustors are given in FIG. 3 ((unit m×$10^{-3}$). (a) is tube #1, (b) is tube #2 and (c) is tube #3. Mixtures of hydrogen and air (22, 23, 24) having a mass flow rate and $H_2$/air ratio controlled accurately by two sets of electronic mass flow controllers were fed into the micro combustor and ignited. The distributions of temperature, both on the exit plane and along the wall of the flame tube, were measured by a 0.203 mm diameter type K thermocouple.

According to the simulation results and experimental data of the three different flame tube combustors, when the flow speed at the inlet drops to 1.3 m/s, because of the great heat losses, the flame extinguishes after a short term combustion, indicating that combustion cannot be sustained in such small flame tubes when the flow rate is too low.

When the flow speed exceeds 8 m/s, combustion does not take place inside the straight tube under any conditions, but may take place outside of the tube. Therefore, stable combustion can only be obtained in the straight tube with flow speeds at the inlet varying from 1.5 to 8 m/s, with the position of the flame core differing for each speed. Furthermore, when increasing the flow rate, a higher $H_2$/air ratio is required to get stable combustion in the flame tube, or the flame will be blown out the exit. At 2 m/s, the peak temperatures on the wall occur at about 5, 14 and 25 mm below the exit plane when the $H_2$/air ratios are 0.45, 0.5 and 0.55, respectively. This indicates that ignition occurs earlier, and that by increasing $H_2$/air ratios can the combustion rate can be increased.

The above study demonstrates that there are some disadvantages with the straight flame tube combustor. Firstly, it is difficult to control the position of the flame, which keeps changing with the variation of working condition. Secondly, combustion cannot be sustained in a straight tube when the $H_2$/air ratio is not high enough, especially for high flow rates. These disadvantages may be addressed by designing another kind of flame tube (tubes #2 and #3) with a sudden expansion step, which is used to facilitate recirculation along the wall, thereby enhancing combustion completeness around the rim of the flow tube and ensuring stable combustion.

Compared to straight tube #1, tubes #2 and #3 with a sudden step can work steadily under a much wider flow rate and wider $H_2$/air ratio. Stable combustion was obtained with flow speeds at the inlet varying from 1.5 to 20 m/s and $H_2$/air ratios varying from 0.45-1.0. At the same time, the sudden step is very useful in ensuring that the flame occurs in the tube downstream of the step.

Figure 13B:
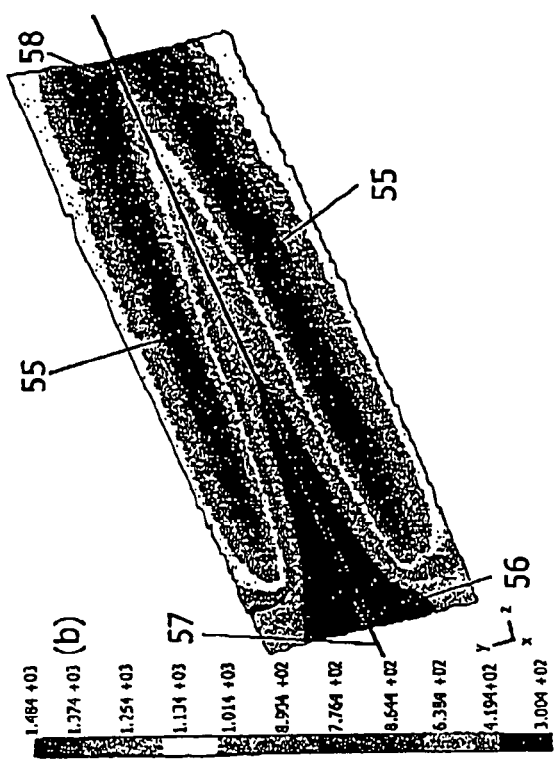
FIG. 13 shows the distribution of temperature on the axial plane of the tubes (velocity: 8 m/s, H2/air ratio: 0.45). (a) is tube #2, and (b) is tube #3.
Figure 13A:
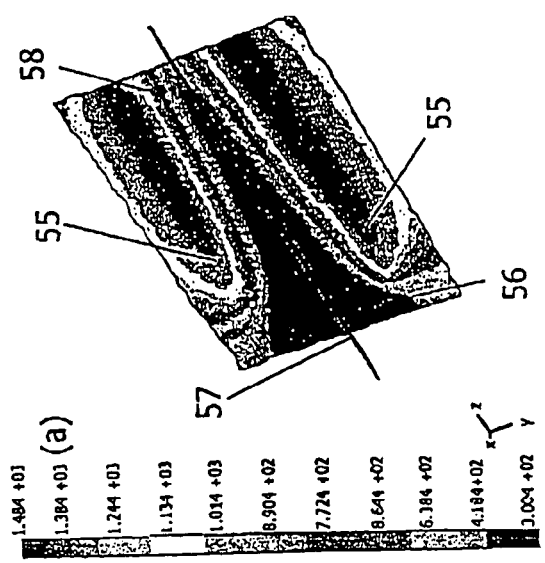
Figure 14:
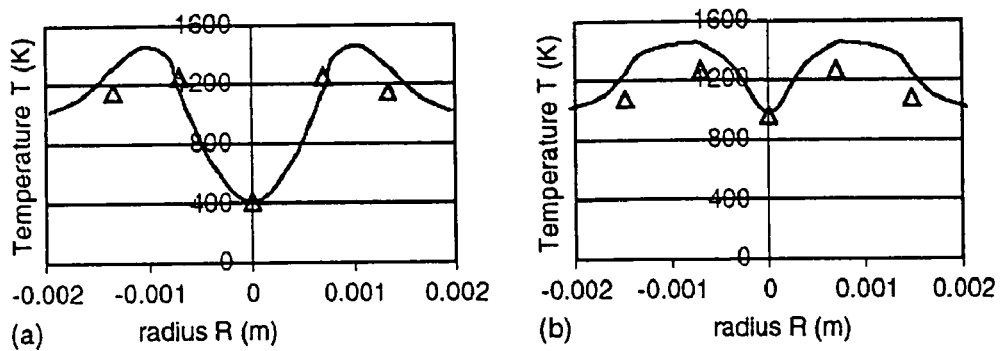
FIG. 14 illustrates the temperature profile on the exit plane obtained by numerical simulation (-) and experimental results (Δ). (a) is tube #2, and (b) is tube #3

It should be mentioned that the tube downstream of the sudden step must be long enough so that the combustion is finished before flowing out the exit. FIG. 13 shows the temperature distribution on the axial plane of tubes #2 and #3 when the velocity at the inlet is 8 m/s and the $H_2$/air ratio is 0.45. Temperature profiles on the exit plane obtained by numerical simulation (represented by −) and experimental testing (represented by Δ) are provided in FIG. 14. From FIG. 13(a), we can see clearly that part of the fuel has not been combusted before flowing out the exit, and therefore, the temperature in the centerline (57) of the exit plane is very low (see FIG. 14(a)). In contrast, the result in FIGS. 13(b) and 14(b) is much better. Furthermore, the completeness of combustion may be further improved by increasing the $H_2$/air ratio (see FIG. 15).

Figure 15:
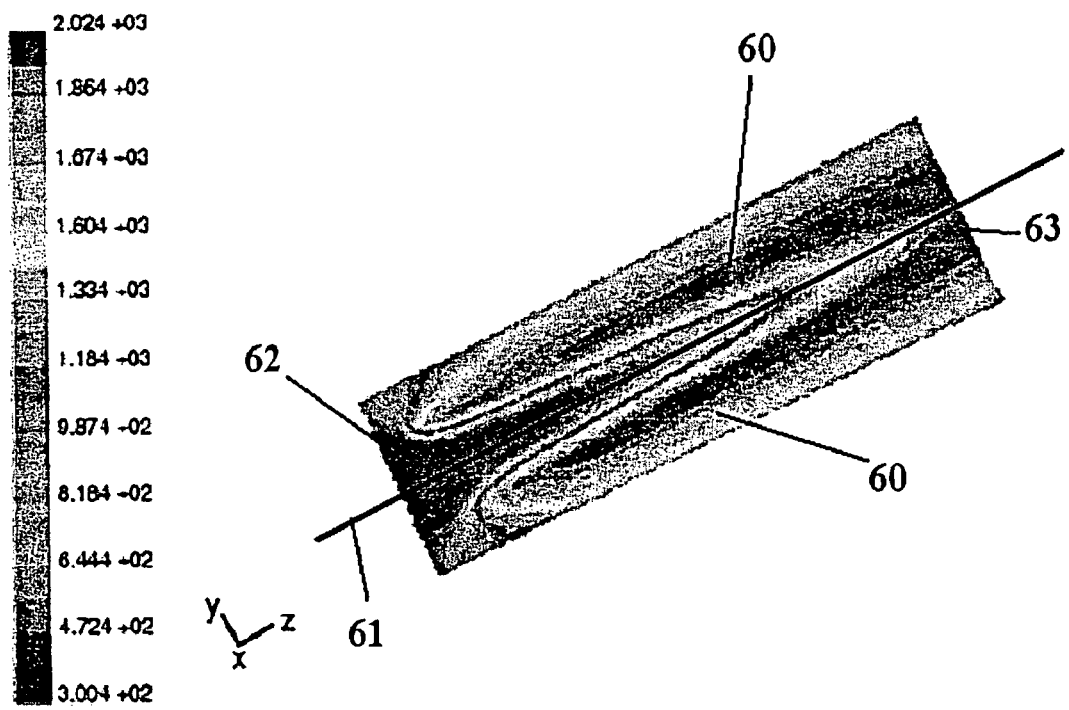
FIG. 15 shows the distribution of temperature on the axial plane of tube #3 (velocity: 8 m/s, H2/air ratio: 0.75).
Figure 16:
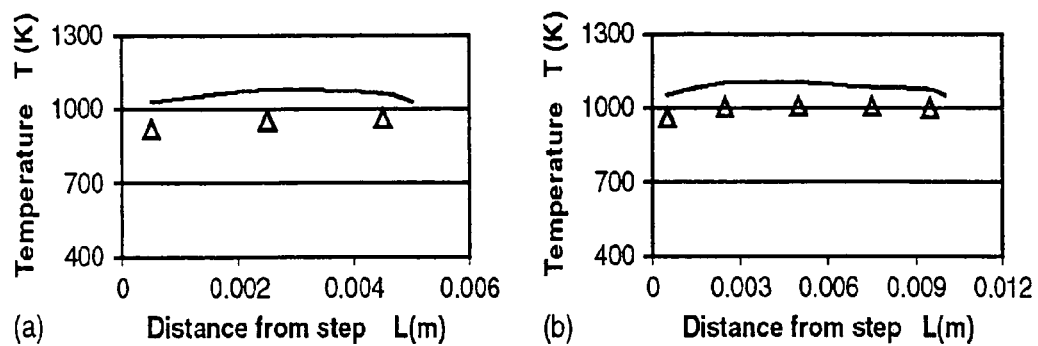
FIG. 16 shows the distribution of temperature along the wall of the combustor (H2/air ratio: 0.45; velocity at inlet: 8 m/s) obtained by numerical simulation (-) and experimental results (Δ). (a) is tube #2, and (b) is tube #3.

FIGS. 13 and 15, illustrate another interesting phenomenon. The combustion takes place near the wall (55, 60) rather than the centerlines (57, 61) of the flame tube at the beginning (56, 62). The fuel/air mixture around the centerline is heated and accelerated by the surrounding combustion products and flows quickly to near the end of flame tube (58, 63) and combusts there, which is favorable for maintaining a uniform temperature along the wall. The distribution of temperature on the wall of the flame tube is depicted in FIG. 16. Both the simulation and experimental results indicate that the maximum difference of temperature along the wall is less than 5%.

This feature of the micro flame tube combustor is very important to the design of a micro TPV system.

According to FIGS. 14 and 16, we know that the temperature distribution profile obtained by numerical simulation (represented by −) is very similar to that obtained by experiment (represented by Δ), and the differences of temperature, both on the exit plane and along the wall, are less than 9%.

Figure 17:
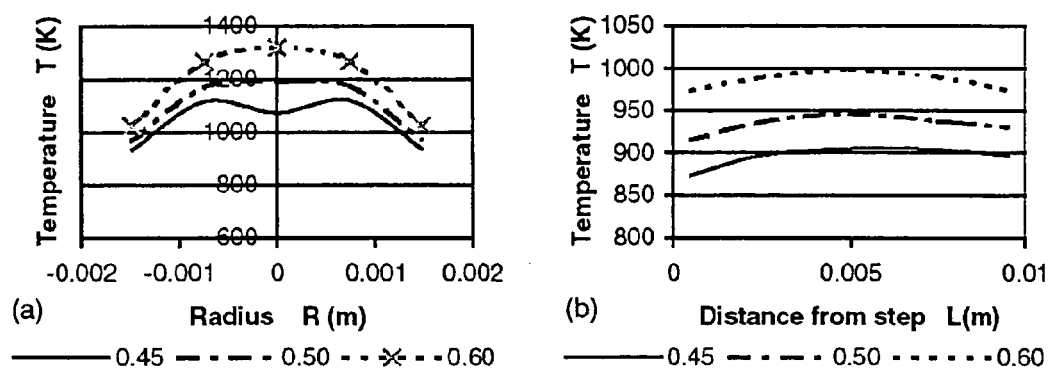
FIG. 17 shows the distribution of temperature (velocity at inlet 5 m/s) (a) on an exit plane, and (b) along the wall.

The $H_2$/air ratio is one of the most important factors effecting microcombustion. It not only affects the combustion rate but also affects the temperature and its distribution. When the flow rate is constant, with increasing $H_2$/air ratio, both the temperatures on the exit plane and along the wall increase drastically, and the position of the peak temperature on the exit plane also moves towards the centerline. This can be seen in FIG. 17, which shows the test results when the velocity at the inlet is 5 m/s.

Figure 18:
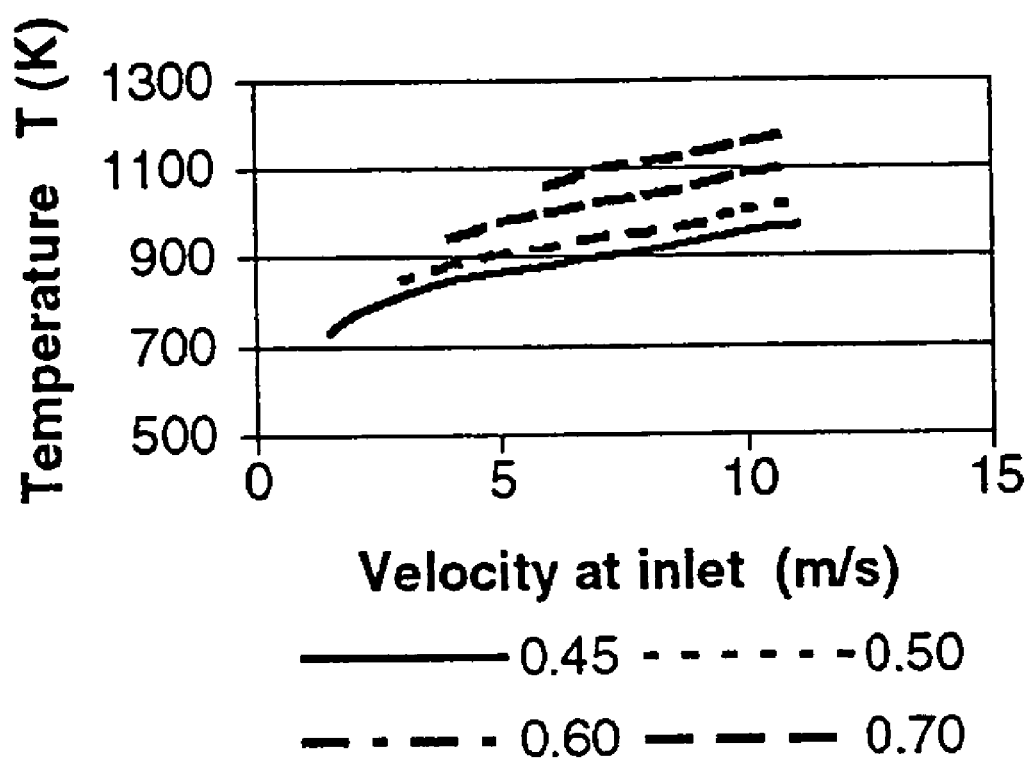
FIG. 18 illustrates the variation of mean wall temperature with velocity.

Flow rate is another important factor affecting the temperatures, both on the exit plane and along the wall of the microcombustor. FIG. 18 shows the variation of mean wall temperature with velocity. With increasing velocity at the inlet, the total energy released by combustion increases, and thereby, the mean wall temperature increases. However, as the flow rate increases further, the effective residence time of the fuel decreases thereby worsening the completeness of combustion, which in turn lowers the efficiency and the temperature on the wall, even quenching the flame. This situation should be avoided.

Figure 8:
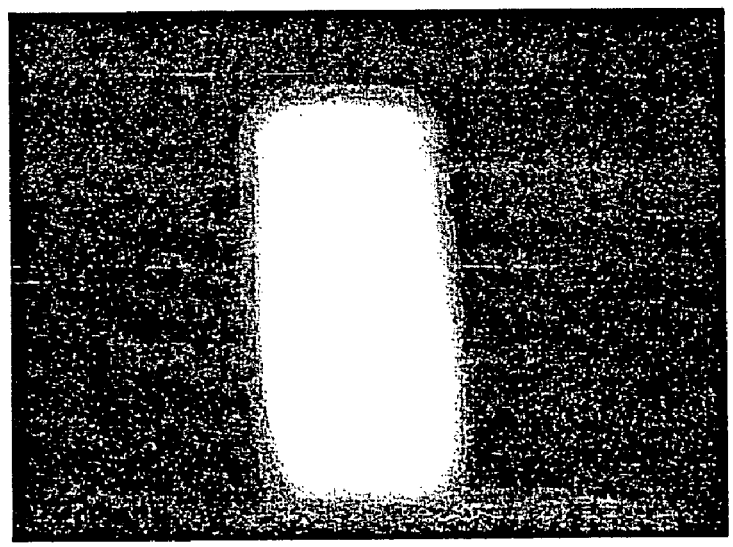
FIG. 8 is a photo of microcombustion (H2 flow rate is 4.2 g/hr, H2/air ratio is 0.9).
Figure 9:
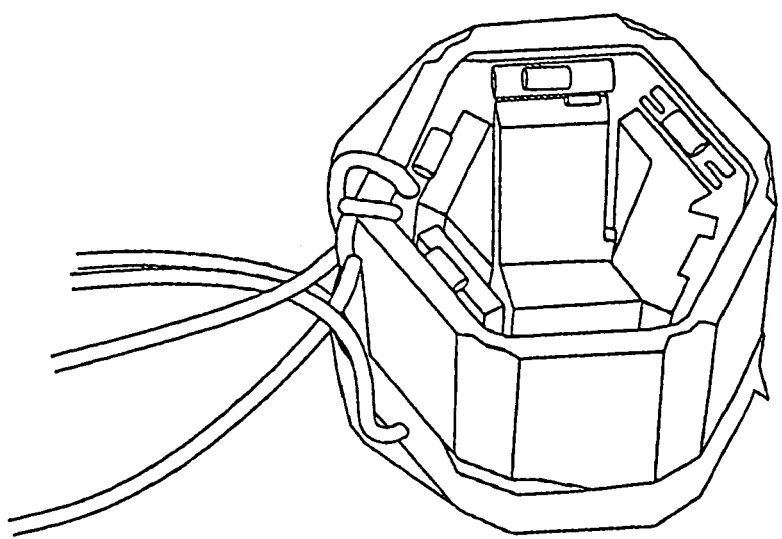
FIG. 9 is a prototype micro-thermophotovoltaic system without a microcombustor.

Optimization yields an average temperature of about 1300 K along the wall, which has been achieved for tube #3 when the flow rate at the inlet is 12 m/s and the $H_2$/air ratio is 0.95, which is suitable as the heat source of a micro TPV system. The photo of microcombustion by digital camera under these conditions is shown in FIG. 8.

Microcombustor Fuel

In microcombustor design, the choice of fuel plays a key role. Compared to a conventional combustor, a microcombustor is more highly constrained by inadequate residence time for complete combustion and high rates of heat transfer from the combustor. This fundamental time constraint can be quantified in terms of a homogeneous Damkohler number $Da_h$, the ratio of gas residence time to the characteristics chemical reaction time. To ensure complete combustion, $Da_h$ must be greater than unity.

$$Da_h = \frac{\tau_{residence}}{\tau_{reaction}} \quad \text{with} \quad \tau_{residence} \approx \frac{VP}{mRT}$$

$$\tau_{reaction} \approx \frac{[fuel]_0}{A[fuel]^a[O_2]^b e^{-E_a/RT_0}}$$

In this work, hydrogen was chosen as the fuel because of its high heating value, fast diffusion velocity and short reaction time. Alternative fuels may be selected from the group comprising, but not limited to fossil fuels such as natural gas, methane, propane and alcohol. It is desirable for a platinum catalyst to be employed on the surface of the micro combustor. If using a liquid fuel, for example oil, petroleum, methanol, and/or ethanol among others, then a heat recurperator should be employed to vaporize the liquid fuel before entering the mixer.

The gas phase kinetics of hydrogen oxidation reactions has been widely studied, and the typical mechanisms consist of 19 reversible reactions and nine species as shown in Table 1. Reactions in this mechanism involve third body collisions, and their reaction rates are expressed as:

$$r_i = k_i \prod_{j=1}^{n_g} C_j^{n_{ij}} \Sigma \alpha_{ij} C_j$$

The other gas phase reactions are written as:

$$r_i = k_i \prod_{j=1}^{n_g} C_j^{n_{ij}}$$

TABLE 1

Gas-phase reaction mechanism of hydrogen oxidation

| Reactions | A | β | $E_a$ (cal/mol) |
|---|---|---|---|
| $O_2 + H = OH + O$ | 5.13E+16 | −0.816 | 16507.0 |
| $H_2 + O = OH + H$ | 1.18E+10 | 1.00 | 8842.7 |
| $H_2 + OH = H_2O + H$ | 1.17E+09 | 1.30 | 3626.0 |
| $OH + OH = H_2O + O$ | 6.00E+08 | 1.30 | 0.0 |
| $H_2 + O_2 = OH + OH$ | 1.70E+13 | 0.00 | 47780.0 |
| $H + OH + M = H_2O + M^a$ | 7.50E+23 | −2.60 | 0.0 |
| $O_2 + M = O + O + M$ | 1.85E+11 | 0.50 | 95560.0 |
| $H_2 + M = H + H + M^b$ | 2.23E+12 | 0.5 | 92600.0 |
| $H + O_2 + M = HO_2 + M^c$ | 2.10E+18 | −1.00 | 0.0 |
| $H + O_2 + O_2 = HO_2 + O_2$ | 6.70E+19 | −1.42 | 0.0 |
| $H + O_2 + N_2 = HO_2 + N_2$ | 6.70E+19 | −1.42 | 0.0 |
| $HO_2 + H = H_2 + O_2$ | 2.50E+14 | 0.00 | 1900.0 |
| $HO_2 + H = OH + OH$ | 2.50E+13 | 0.00 | 700.0 |
| $HO_2 + O = OH + O_2$ | 4.80E+13 | 0.00 | 1000.0 |
| $HO_2 + OH = H_2O + O_2$ | 5.00E+13 | 0.00 | 1000.0 |
| $HO_2 + HO_2 = H_2O_2 + O_2$ | 2.00E+12 | 0.00 | 0.0 |
| $H_2O_2 + M = OH + OH + M$ | 1.30E+17 | 0.00 | 45500.0 |
| $H_2O_2 + H = H_2 + HO_2$ | 1.60E+12 | 0.00 | 3800.0 |
| $H_2O_2 + OH = H_2O + HO_2$ | 1.00E+13 | 0.00 | 1800.0 |

Rate constants are given in the form of $k = AT^\beta \exp(-E_a/T)$.
[a]Enhancement factors: $H_2O = 20.0$.
[b]Enhancement factors: $H_2O = 6.0$, $H = 2.0$, $H_2 = 3.0$.
[c]Enhancement factors: $H_2O = 21.0$, $H_2 = 3.3$, $O_2 = 0.0$, $N_2 = 0.0$.

$\alpha_{ij}$ is unity except as specified in Table 1. Given the rate constant data in Table 1, the species generation rate can be written as:

$$w_j = \sum_{k=1}^{N_r} v_{jk} R_k$$

with $R_k$ being expressed as:

$$R_k = r_{kf} - r_{kb}$$

PV Cell

Compared to PV conversion of solar energy, the photons emitted from a heat source at 1000-1600K are distributed at much lower energies and longer wavelengths. This necessitates the use of low band gap semiconductors for the TPV energy conversion diode, in order to simultaneously maximize both the efficiency and the power density. Although the concept of TPV energy conversion was first proposed in 1960's, it was only in recent years that technological improvements in the field of low band gap photovoltaic cells and high temperature materials have evoked a renewed interest in TPV generation of electricity. GaSb, GaInAs and InGaAsSb are possible low bandgap PV cells developed recently for use in the present invention. Corresponding with the filter to be introduced in the next section, a GaSb PV cell array was designed and fabricated for the micro-TPV system. This GaSb cell array responded out to 1.8 microns. The technology used to form the pn junction was based on a Zn vapour diffusion process into an n-doped GaSb substrate. Thus, expensive epitaxial growth of thin semiconductor layers was successfully avoided. The Zn vapour diffusion process may be performed in a so-called 'pseudo-closed' box. A suitable diffusion source is a mixture of Zn and antimony.

Firstly, an n-type GaSb wafer doped with Te was coated with a silicon-nitride diffusion barrier and standard photolithography was used to open holes in the dielectric. A pn junction was then formed by zinc diffusion through the mask opening. The diffuision creates a Zn-doped p-type GaSb emitter. The front patterned side of the wafer was protected with photoresist, while the junction was removed from the back side of the wafer with a nonselective etch. The backside of the wafer was then metallized. The front-side metallization area was defined by standard liftoff photolithography and metal evaporation. Finally, etching of the emitter and deposition of an antireflection (AR) coating was performed to maximize photocurrent.

Figure 7:
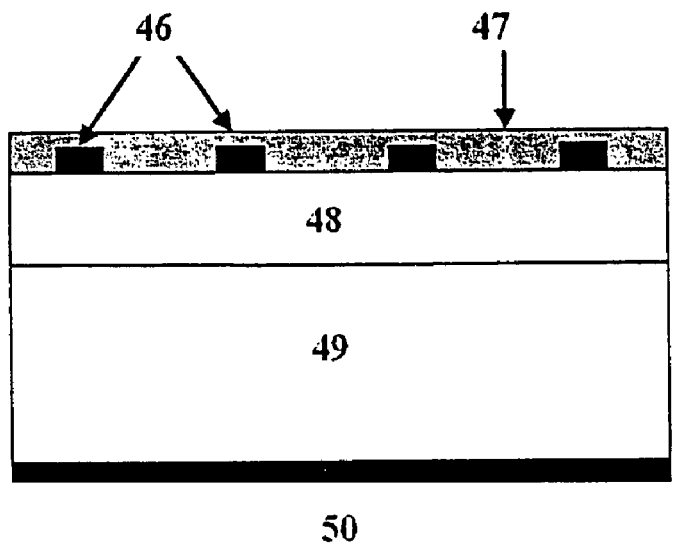
FIG. 7 is a scheme of a GaSb cell fabricated by Zn vapour diffusion processes.

FIG. 7 shows the scheme of a GaSb PV cell fabricated by Zn vapour diffusion process. Front contact bus line (46) is coated by antireflection (AR) coating (47) and sits atop Zn-diffused p-type GaSb emitter (48). Beneath emitter (48) lies n-doped GaSb substrate (49) which is disposed atop rear contact metal layer (50) having low resistance. The quantum efficiency of the GaSb cell is shown in FIG. 10.

Figure 6:
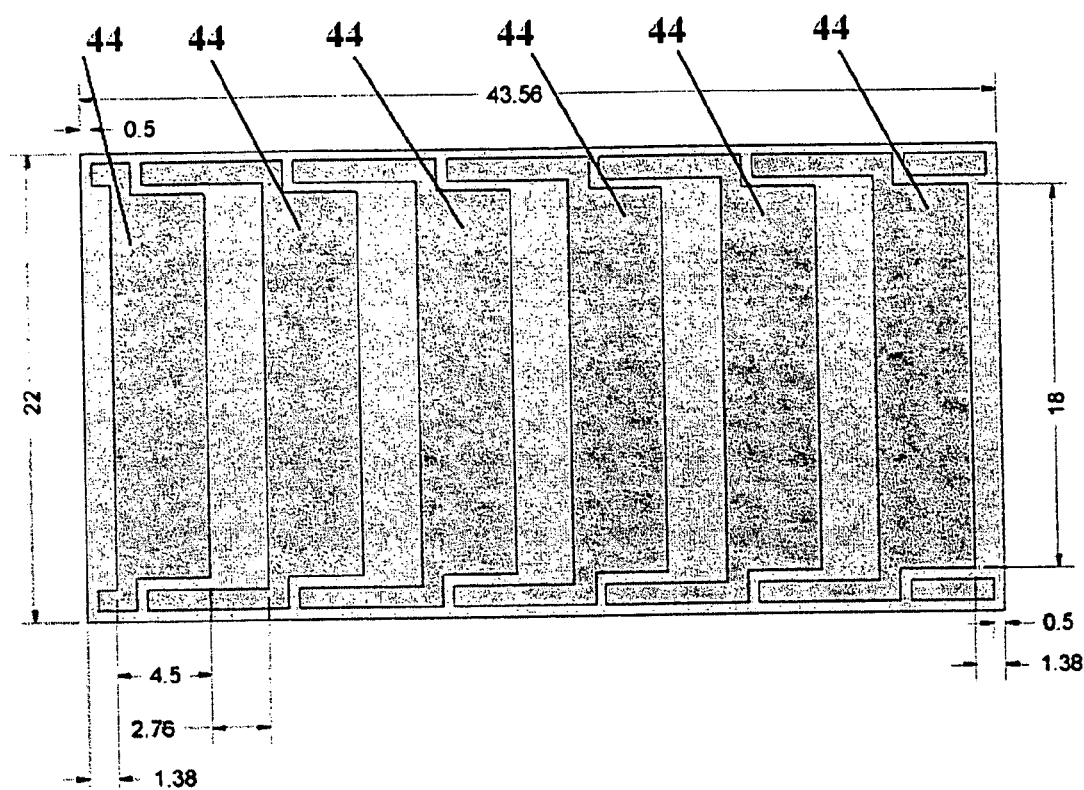
FIG. 6 is a circuit board of a PV cell array (units in mm).

FIG. 6 is the circuit board of PV cell array. The circuit is composed of six 4.5 mm×18 mm planar GaSb cells (44) disposed tandemly. The active area is 4.3 mm×16 mm for each cell. The length of GaSb PV cells L3 can be adjusted according to the variation of the length of emitter, i.e. any value from 10 mm to 30 mm. Furthermore, the PV cell array can also be made of other low bandgap materials such as GaInAs or GaInAsSb.

Filter

Figure 4:
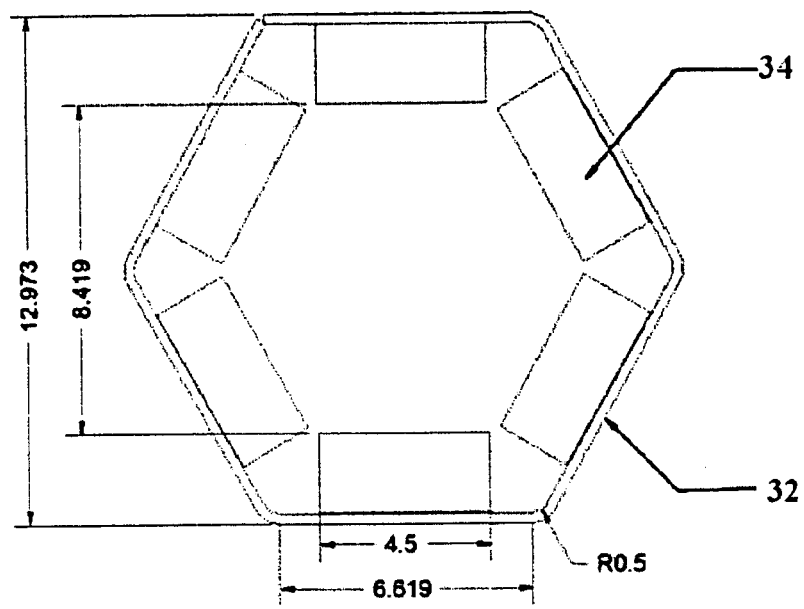
FIG. 4 is a Hexagonal GaSb PV cell circuit incorporated with filters.
Figure 5:
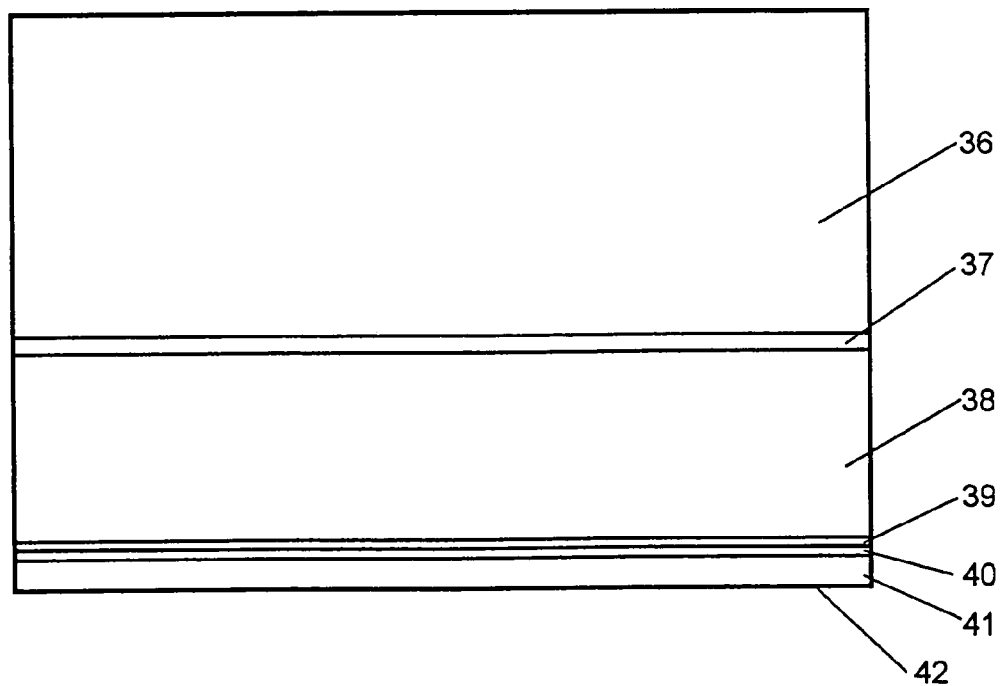
FIG. 5 is a cross section of a filter and PV cell arrangement of the invention.
Figure 11:
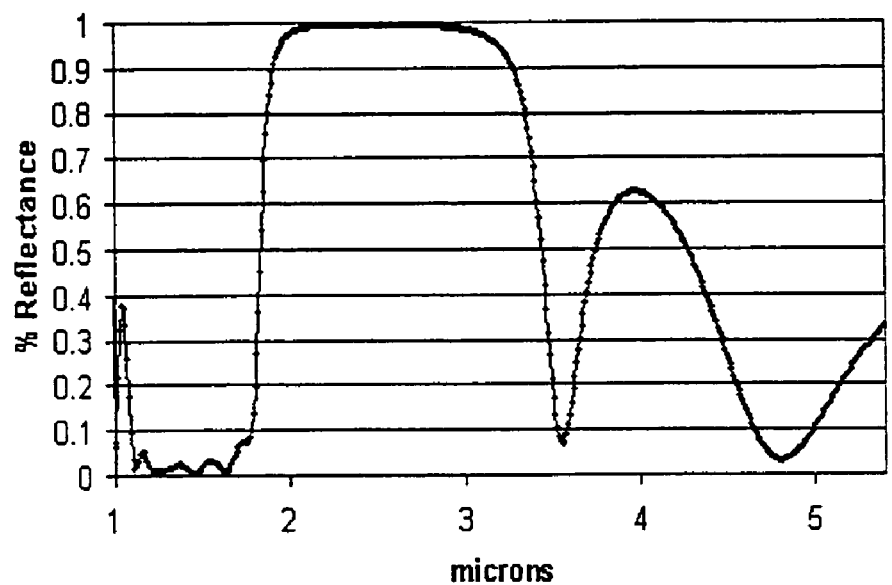
FIG. 11 illustrates the reflectance of a nine layer dielectric filter.

FIG. 4 is the hexagonal circuit bended from above PV cell array shown in FIG. 5. There is a simple nine layer filter employed in the micro-TPV system. The filter is able to recycle the energy emitted in the 1.8 to 3.5 micron mid-wavelength band. A filter and PV cell arrangement (34) are joined to copper base (32). A cross section of the arrangement of the filter and PV cell (34) is provided in FIG. 5. The filter is fabricated with alternating layers of silicon and silicon dioxide and is deposited on a glass slide (36) (total 1.090 mm), and bonded on the top of GaSb PV cells (38) (0.635 mm) with silicone (37) (0.051 mm). The reflectance of the filter is shown in FIG. 11. The PV cells are bonded on the copper foil (40) (0.038 mm) by solder (39) (0.025 mm). The copper foil (40) is deposited on an epoxy dielectric (41) (0.102 mm) which is painted on the copper base (42). This method makes the assembly of micro-TPV system very convenient.

The cooling fins may be any suitable materials such as copper or aluminum. The cooling fins may be 0.1-0.2 mm in thickness and 5-15 mm in height, with the distance between fins being between 0.5-1.5 mm. It is expected that the cooling fins may remove between about 0.5 and about 3 W of heat per cm$^2$ surface at 60° C.

The micro-TPV system fully utilizing the high surface-to-volume ratio of microcombustor, can deliver 0.5 W-10 W electrical power output when the sizes and materials of the emitter and PV cells are appropriately adjusted. The electrical power output may also be controlled by adjusting the flow rate of fuel.

Figure 12:
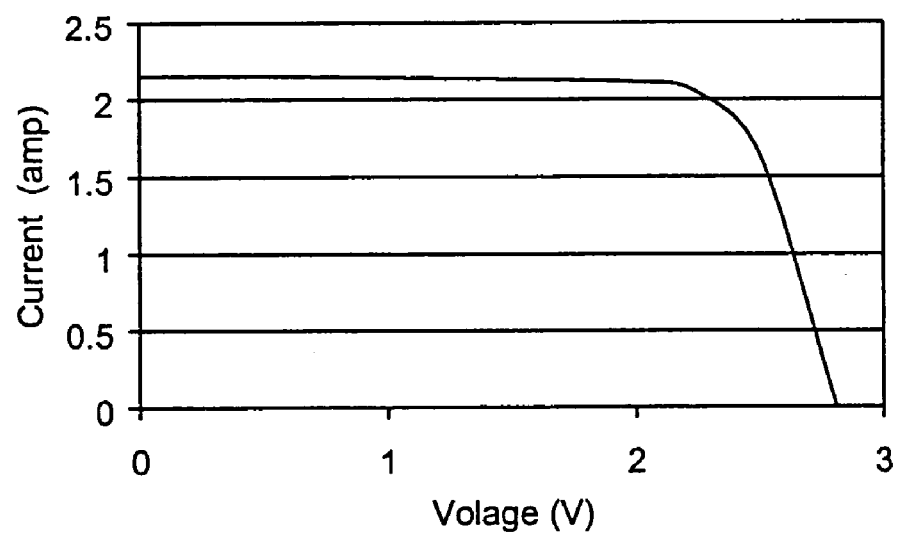
FIG. 12 is a I-V curve of the GaSb PV circuit with filters.

The GaSb PV circuits with filters were first measured with a flash lamp solar simulator. Table 2 summarizes the performance of five GaSb PV circuits incorporated with filters. The results indicate that the GaSb PV circuits offer a very good electrical conversion performance. The open-circuit voltage and short-circuit current are greater than 2.78 V and 2.12 amp respectively. The maximum electrical power outputs are greater than 4.42 W, corresponding to an output power density greater than 1.11 W/cm$^2$. The I-V curve of the second GaSb PV circuit with filters is shown in FIG. 12.

TABLE 2

Performance of GaSb PV circuits incorporated with filters

|   | FF    | $V_{oc}$ (V) | $I_{sc}$ (amp) | $V_{max}$ (V) | $I_{max}$ (amp) | $P_{max}$ (W) |
|---|-------|--------------|----------------|---------------|-----------------|---------------|
| 1 | 0.750 | 2.78         | 2.12           | 2.34          | 1.90            | 4.44          |
| 2 | 0.761 | 2.81         | 2.15           | 2.24          | 2.05            | 4.60          |
| 3 | 0.738 | 2.79         | 2.15           | 2.32          | 1.91            | 4.42          |
| 4 | 0.752 | 2.84         | 2.25           | 2.36          | 2.03            | 4.80          |
| 5 | 0.757 | 2.82         | 2.23           | 2.36          | 2.01            | 4.75          |

The electrical power output of the prototype micro-TPV system incorporated with a SiC emitter was measured for all kinds of flow rate and H$_2$/air ratio. When the hydrogen flow rate was 4.20 g/hr and the H$_2$/air ratio 0.9, an electrical power output of 1.02 W was obtained for the second micro-TPV system. The open-circuit voltage and short-circuit current were 2.32 V and 0.58 amp respectively.

What is claimed is:

1. A micro TPV generator for generating an electric current in response to combustion of a fuel comprising, in combination:
   an inlet and a combustor downstream from the inlet, wherein the combustor comprises a first section and a second section positioned between the inlet and the first section, wherein a cross-sectional width of the first section is greater than a cross sectional width of the second section;
   the first section forms an internal chamber having an outer wall, and an internal expansion step comprises transitioning from the second section to the first section, and combustion of the fuel occurs at the first section;
   an emitter formed around the outer wall, wherein the emitter is capable of generating photons; and
   a photovoltaic cell in proximity to the emitter, which begins at the expansion step, extends along the first section and generates the electrical current depending on photons incident thereon.

2. A micro TPV generator as claimed in claim 1 wherein the internal chamber comprises a platinum catalyst coating an inner wall thereof.

3. A micro TPV generator as claimed in claim 2 wherein the outer wall is substantially cylindrical.

4. A micro TPV generator as claimed in claim 3 wherein the expansion step is a backwards facing step.

5. A micro TPV generator as claimed in claim 4 wherein the emitter has an emission characteristic matched to a bandgap characteristic of the photovoltaic cell.

6. A micro TPV generator as claimed in claim 5 wherein the emitter is formed of Co—/Ni-doped MgO ribbon or tape.

7. A micro TPV generator as claimed in claim 5 wherein the emitter is formed of SiC.

8. A micro TPV generator as claimed in claim 5 further comprising a filter between the emitter and the photovoltaic cell configured to pass photons above a threshold and reflect photons under the threshold.

9. A micro TPV generator as claimed in claim 8 wherein the filter comprises 9 layers of Si—$SiO_2$ bonded between a glass slide and the photovoltaic cell.

10. A micro TPV generator as claimed in claim 9 wherein the photovoltaic cell is formed from a GaSb based semiconductor.

11. A micro TPV generator as claimed in claim 1 wherein the internal chamber has an internal diameter less than 1 mm when the fuel is hydrogen fuel at compressed pressure.

12. A micro TPV generator as claimed in claim 1 wherein the internal chamber has an internal diameter less than 3 mm when the fuel is propane at atmospheric pressure.

13. A micro TPV generator as claimed in claim 1 further comprising a filter positioned between the emitter and the photovoltaic cell configured to pass photons above a threshold and reflect photons under the threshold, wherein the filter begins at the transition step and extends along the first section.

14. A micro TPV generator as claimed in claim 13 wherein the first section has an end opposite the transition step, and both the photovoltaic cell and the filter end at the end of the first section.

15. A micro TPV generator as claimed in claim 1 wherein the photovoltaic cell is fabricated from one or more of:
   InGaSb, and
   InGaAsSb.

16. A micro TPV generator as claimed in claim 5 wherein the combustor comprises SiC.

17. The micro TPV generator of claim 1 wherein the emitter is formed as part of the combustor.

18. A micro TPV generator as claimed in claim 1 comprising a hexagonal cell arrangement.

\* \* \* \* \*